(12) United States Patent
Kato (10) Patent No.: US 9,070,769 B2
(45) Date of Patent: Jun. 30, 2015

(54) SEMICONDUCTOR DEVICE WITH A DEPLETION CHANNEL AND METHOD OF MANUFACTURING THE SAME

(75) Inventor: Yoshiki Kato, Mie-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 552 days.

(21) Appl. No.: 13/184,654

(22) Filed: Jul. 18, 2011

(65) Prior Publication Data

US 2012/0018805 A1    Jan. 26, 2012

(30) Foreign Application Priority Data

Jul. 20, 2010   (JP) .................................. 2010-162766

(51) Int. Cl.
| H01L 27/12 | (2006.01) |
| H01L 29/78 | (2006.01) |
| H01L 21/033 | (2006.01) |
| H01L 21/762 | (2006.01) |
| H01L 29/10 | (2006.01) |

(52) U.S. Cl.
CPC ........ *H01L 29/7833* (2013.01); *H01L 21/0332* (2013.01); *H01L 21/76224* (2013.01); *H01L 21/76237* (2013.01); *H01L 29/1079* (2013.01)

(58) Field of Classification Search
CPC ..................... H01L 21/0332; H01L 21/76224; H01L 21/76237; H01L 29/7833; H01L 29/1079; H01L 29/76237
USPC ......... 257/305, 345, 348, 349, 398, 399, 400, 257/519, 652, E21.545, E21.551, 392, 257/E27.061, E21.631
See application file for complete search history.

(56) References Cited

U.S. PATENT DOCUMENTS

2009/0218637 A1*  9/2009  Gomikawa et al. ............ 257/402
2011/0089513 A1*  4/2011  Endo .............................. 257/431

FOREIGN PATENT DOCUMENTS

| GB | 2243948 | * 11/1991 | ............ H01L 29/784 |
| JP | 64-89367 | 4/1989 | |
| JP | 64-089367 | * 4/1989 | ............ H01L 29/78 |
| JP | 2-304980 | 12/1990 | |
| JP | 02-304980 | * 12/1990 | ............ H01L 29/784 |
| JP | 11-297814 | * 10/1999 | ............ H01L 21/76 |
| JP | 2009-44000 | 2/2009 | |

OTHER PUBLICATIONS

Office Action issued Sep. 24, 2013, in Japanese Patent Application No. 2010-162766, filed Jul. 20, 2010 (English only).

* cited by examiner

*Primary Examiner* — Benjamin Sandvik
*Assistant Examiner* — Farid Khan
(74) *Attorney, Agent, or Firm* — Oblon, McClelland, Maier & Neustadt, L.L.P.

(57) ABSTRACT

According to embodiments, a semiconductor device includes a semiconductor substrate and an element isolation insulating film which isolates a element formation region in a surface portion of the semiconductor substrate. A depletion-type channel region of a first conductivity type is formed in an inner region which is in the element formation region of the semiconductor substrate and is a predetermined distance or more away from the element isolation insulating film. A gate electrode is formed above the element formation region with a gate insulating film located in between in such a manner as to traverse over the channel region and to overlap with portions of the element isolation insulating film which are located on both sides of the element formation region. Source/drain regions of the first conductivity type are formed in the channel region respectively on both sides of the gate electrode.

8 Claims, 11 Drawing Sheets

SEMICONDUCTOR DEVICE WITH A DEPLETION CHANNEL AND METHOD OF MANUFACTURING THE SAME

CROSS-REFERENCE TO RELATED APPLICATION

This application is based upon and claims the benefit of priority from the prior Japanese Patent Application No. 2010-162766, filed on Jul. 20, 2010, the entire contents of which are incorporated herein by reference.

FIELD

Embodiments described herein relate generally to a semiconductor device and a method of manufacturing the semiconductor device.

BACKGROUND

As a design rule becomes finer in a semiconductor integrated circuit, there is a concern over a reverse narrow channel effect and an increase of a leak current between elements of a MOSFET as a semiconductor device to be formed inside the semiconductor integrated circuit. As a remedy for these, ions of the same conductivity type as that of a semiconductor substrate are implanted into, for example, a side surface and a bottom surface of an element isolating region. This can reduce influence of the reverse narrow channel effect and the leak current between elements.

However, when a depletion-type n-channel MOSFET is formed, for example, there is a large difference in concentration due to an n-type impurity in the n-type channel region formed in a p-type semiconductor substrate and a p-type impurity formed in the side surface of the element isolating region. This might lower a breakdown voltage in junction between source/drain regions and the semiconductor substrate (or P-well region).

Hence, there is a desire of enhancing the breakdown voltage in a structure having the depletion-type channel region.

DETAILED DESCRIPTION

According to embodiments, a semiconductor device includes a semiconductor substrate and an element isolation insulating film which isolates an element formation region in a surface portion of the semiconductor substrate. A depletion-type channel region of a first conductivity type is formed in an inner region which is in the element formation region of the semiconductor substrate and is a predetermined distance or more away from the element isolation insulating film. A gate electrode is formed above the element formation region with a gate insulating film located in between in such a manner as to traverse over the channel region and to overlap with portions of the element isolation insulating film which are located on both sides of the element formation region. Source/drain regions of the first conductivity type are formed in the channel region respectively on both sides of the gate electrode.

According to one of the embodiments, a method of manufacturing a semiconductor device is performed in the following manner. Specifically, an impurity of a first conductivity type is introduced into a region in a surface portion of a semiconductor substrate to form a depletion-type channel region. A gate insulating film and a gate electrode film are formed in order on an upper surface of the semiconductor substrate. The gate electrode film, the gate insulating film, and the semiconductor substrate are processed to form an element isolating trench in an outer region which is a predetermined distance or more away from a periphery of the channel region. An impurity of a second conductivity type is introduced into the element isolating trench to form an impurity region along a wall surface of the semiconductor substrate, the wall surface facing the element isolating trench. An insulating film is embedded in the element isolating trench to form an element isolation insulating film. The gate electrode film is processed to form a gate electrode. An impurity of the first conductivity type is introduced into the channel region on both sides of the gate electrode to form source/drain regions.

According to one of the embodiments, a method of manufacturing a semiconductor device is performed in the following manner. Specifically, a processing film is formed on an upper surface of a semiconductor substrate. An element isolating trench is formed in a surface portion of the semiconductor substrate in such a manner that an element formation region is left. An impurity of a second conductivity type is introduced into the element isolating trench in such a manner that an impurity region is formed along a wall surface of the semiconductor substrate, the wall surface facing the element isolating trench. An insulating film is embedded in the element isolating trench in such a manner that an element isolation insulating film is formed. An impurity of a first conductivity type is introduced into an inner region which is in the element formation region of the semiconductor substrate and is a predetermined distance or more away from a periphery of the element formation region in such a manner that a depletion-type channel region is formed. A gate insulating film and a gate electrode film are formed in order on the upper surface of the semiconductor substrate. The gate electrode film is processed in such a manner that a gate electrode is formed. An impurity of the first conductivity type is introduced into the channel region on both sides of the gate electrode in such a manner that source/drain regions are formed.

(First Embodiment)

Hereinbelow, a description is given of a first embodiment of the present invention with reference to FIGS. 1A to 7J. Note that, in the following description of the drawings, same or similar reference numerals denote same or similar portions. In addition, the drawings are schematic, and a relationship between a thickness and a plan dimension, a ratio of layer thicknesses, and the like are different from actual ones. It should be noted that the embodiment does not limit the present invention.

Figures 1, 1A, 1B:
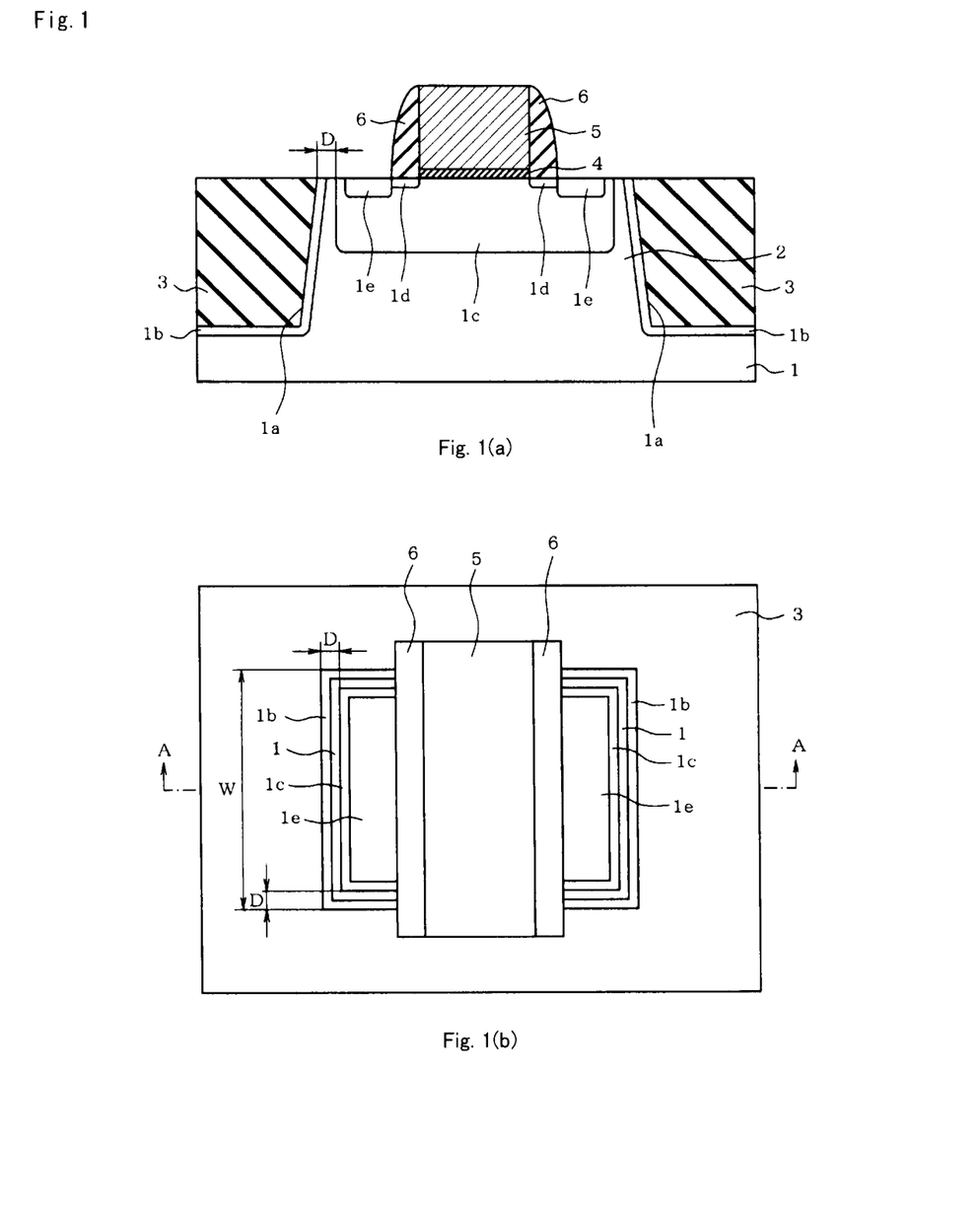
FIG. 1A is a schematic cross-sectional diagram according to a first embodiment.
FIG. 1B is a schematic plan diagram according to the first embodiment.

FIGS. 1A and 1B show a structure of a depletion-type MOSFET which is a semiconductor device provided as a high-voltage MOSFET in a peripheral circuit of, for example, a NAND flash memory device which is a semiconductor integrated circuit. FIG. 1B shows a schematic plan diagram. A vertical cross-sectional side diagram of a portion taken along the A-A line of FIG. 1B is shown in FIG. 1A.

In FIGS. 1A and 1B, a silicon substrate 1 of a p-type (corresponding to a second conductivity type to be described later) is used as a semiconductor substrate. In the silicon substrate 1, a trench 1a is formed, as an element isolating trench, from an upper surface of the silicon substrate 1 to a predetermined depth. An element formation region 2 having a square top surface shaped into an island on a surface portion of the silicon substrate 1 is formed while being isolated from other components surrounding the element formation region 2. An element isolation insulating film 3 formed of a silicon oxide film or the like is embedded in the trench 1a.

A p-type impurity of the second conductivity type is introduced at a high concentration up to a predetermined depth along a side surface and a bottom surface of the trench 1a on the element isolation insulating film 3 side of the silicon substrate 1. Thereby, a p-type impurity region 1b is formed. The p-type impurity region 1b is provided to prevent the reverse narrow channel effect and the leak current between elements. An n-type impurity of a first conductivity type is introduced into a portion which is in the element formation region 2 of the silicon substrate 1 and is a distance D away from a periphery of the element formation region 2. Thereby, an n-channel region 1c of a depletion type is formed up to a predetermined depth. The distance D is set, for example, in a range from several hundred nm to 1 μm, approximately. The n-channel region 1c is formed in an inner location which is also away from the aforementioned p-type impurity region 1b. A portion which remains as a silicon substrate 1 is exposed between the n-channel region 1c and the p-type impurity region 1b.

A gate electrode 5 having a predetermined width is formed above a central portion of the element formation region 2 with a gate insulating film 4 placed in between. The gate electrode 5 is formed in such a manner as to traverse over the element formation region 2 and to overlap with portions, of the element isolation insulating film 3, on both sides of the gate electrode 5. The gate electrode 5 separates the top surface of the element formation region into two regions. Spacer insulating films 6 using silicon oxide films are formed on side surfaces of the gate electrode 5. N-type lightly doped drain (LDD) regions 1d are formed in the two regions, of the element formation region 2, separated by the gate electrode 5, respectively.

Source/drain regions 1e into which a high-concentration n-type impurity is introduced are further formed in the two regions of the element formation region 2, respectively, which each have an LDD structure. Each of the LDD regions 1d and the source/drain regions 1e is formed in a region inside the n-channel region 1c.

In the aforementioned structure, a MOSFET in the element formation region 2 is formed in such a manner that a periphery of the n-channel region 1c is located inward and is the distance D away from the periphery of the element formation region 2, the distance D being set as a predetermined distance or more. Specifically, the predetermined distance or more is not less than a distance at which the n-channel region 1c is substantially away from the p-type impurity region 1b formed along the side surface of the trench 1a. What is required is to set the distance D so that the condition above can be satisfied. This can prevent formation of a pn junction having a large concentration difference resulting from overlapping of the p-type impurity region 1b and the depletion-type n-channel region 1c. That is, an electric field applied between the p-type impurity region 1b and the depletion type n-channel region 1c is alleviated, and thus the breakdown voltage of the MOSFET can be enhanced.

Figure 2:
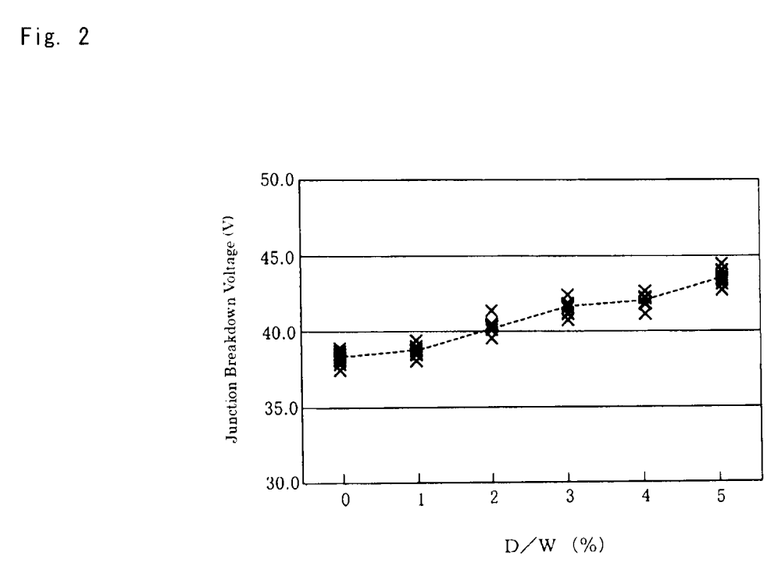
FIG. 2 is a graph showing a relationship between a location in which a channel region is formed and a breakdown voltage according to the first embodiment.

Based on results of actual measurements made by the inventors, an effect as shown in FIG. 2 can be confirmed. Specifically, in FIG. 2, W denotes a distance of a portion of the element formation region 2 over which the gate electrode 5 traverses, and a horizontal axis of the graph in FIG. 2 represents a value (D/W) obtained by dividing the distance D between the periphery of the n-channel region 1c and the periphery of the element formation region 2 by the distance W. Thus, FIG. 2 shows plotted data of an actual breakdown voltage with respect to the D/W value.

In FIG. 2, data in a case of D/W=0% represents a state in which the periphery of the n-channel region 1c reaches the periphery of the element formation region 2. In sum, this structure corresponds to a structure in which the n-channel region 1c overlaps with the p-type impurity region 1b. This is a comparison example, not to be discussed in this embodiment. The data in the case of D/W=0% shows breakdown voltages of approximately 37 V to 39 V.

In contrast, data in a case of D/W=1% or more corresponds to the structure in this embodiment. The periphery of the n-channel region 1c is substantially away from the p-type impurity region 1b. The breakdown voltage is enhanced in comparison with the data in the case of D/W=0%. In addition, it can be confirmed that the breakdown voltage is gradually enhanced with the increase of the D/W value from 1%. FIG. 2 shows that when the D/W value is 5%, the breakdown voltage is enhanced to approximately 42 V to 45 V. To put it differently, the results show that, in order to obtain a desired level of the breakdown voltage of a depletion-type MOSFET, how high D/W value should be set in the structure of the MOSFET.

Next, a description is given of a manufacturing process of a MOSFET having the above structure with reference to FIGS. 3A to 7J. Note that FIGS. 3A to 7J showing a series of steps each illustrate a schematic cross-section of the portion corresponding to the portion shown in FIG. 1A, that is, the portion taken along the A-A cross-sectional line in FIG. 1B. The manufacturing process to be described below is based on a manufacturing process for a NAND flash memory device. In particular, a manufacturing process applied to one suitable for a peripheral circuit is shown below.

Figure 3A:
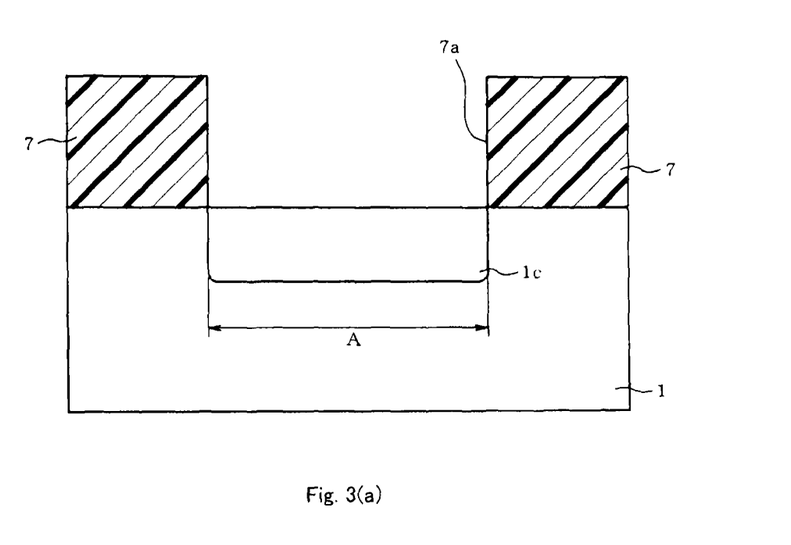
FIGS. 3A and 3B are schematic cross-sectional diagrams in steps of a manufacturing process according to the first embodiment.

Firstly, as shown in FIG. 3A, a resist is applied to the p-type silicon substrate 1 to form a resist film 7. Subsequently, patterning is performed by light exposure to form an opening 7a. Then, an n-type impurity is introduced into the silicon substrate 1 by ion implantation by using, as a mask, the resist film 7 having the opening 7a. Thereby, the depletion-type n-channel region 1c is formed in a surface portion of the silicon substrate 1.

Figure 3B:
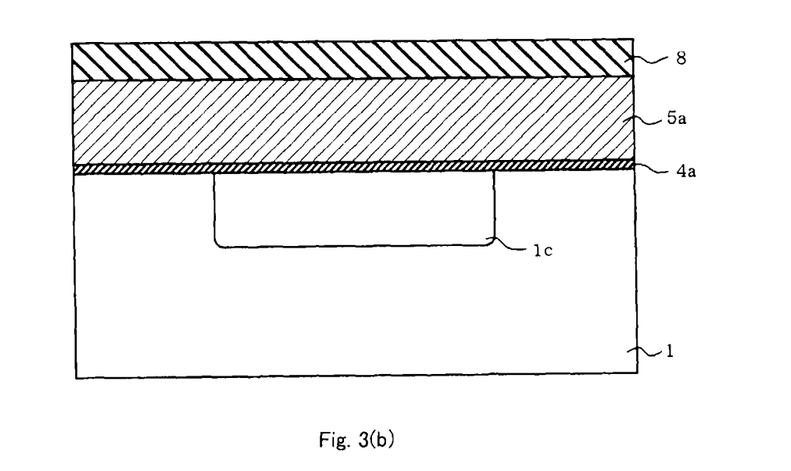

Next, as shown in FIG. 3B, the resist film 7 is stripped, and then a silicon oxide film 4a for the gate insulating film 4, a polysilicon film 5a for the gate electrode 5, and a silicon nitride film 8 for processing are stacked on the silicon substrate 1 in order. Instead of the silicon oxide film 4a, a silicon oxide nitride film or another insulating film suitable for a gate insulating film may be used.

Figure 4C:
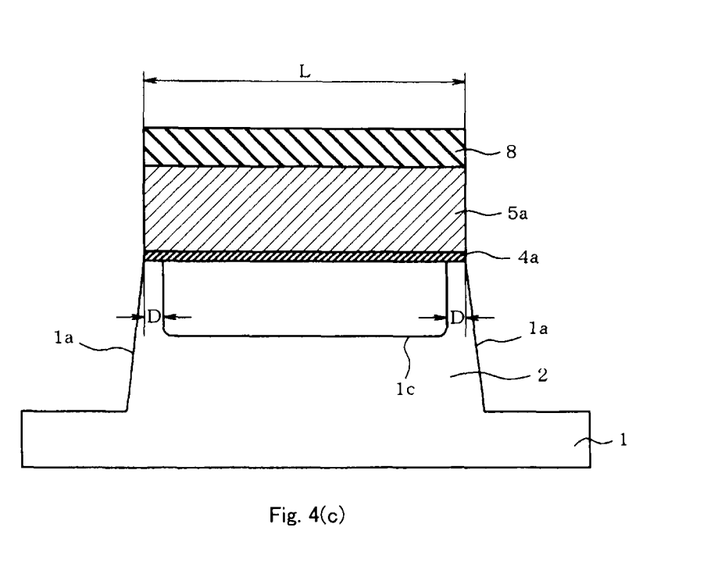
FIGS. 4C and 4D are schematic cross-sectional diagrams in steps, continued from FIG. 3B, of the manufacturing process according to the first embodiment.

Then, as shown in FIG. 4C, a resist film is formed into a mask pattern by a photolithography method. Etching is performed on the silicon nitride film 8, the polysilicon film 5a, and the silicon oxide film 4a as well as the silicon substrate 1 by a reactive ion etching (RIE) method to form the trench 1a having the predetermined depth. The trench 1a is processed to have a square shape so that the silicon substrate 1 can be left to have the distance D from the periphery of the n-channel region 1c formed in the silicon substrate 1. This results in the element formation region 2 isolated in the surface portion of the silicon substrate 1 and the n-channel region 1c formed in an inner region of the element formation region 2.

Figure 4D:
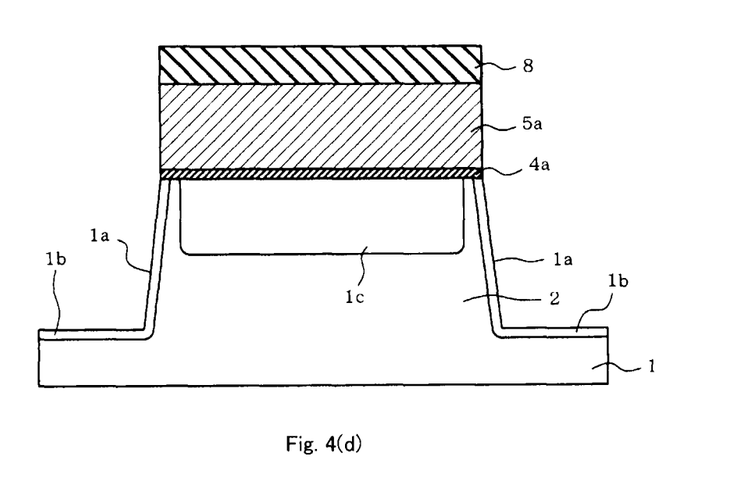

Next, as shown in FIG. 4D, p-type impurity ions are implanted along the side surface and the bottom surface of the formed trench 1a to form the p-type impurity region 1b.

Figure 5E:
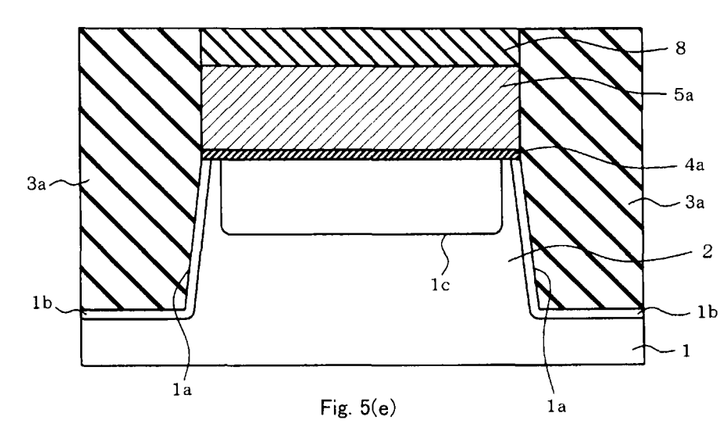
FIGS. 5E and 5F are schematic cross-sectional diagrams in steps, continued from FIG. 4D, of the manufacturing process according to the first embodiment.

Subsequently, as shown in FIG. 5E, an insulating film such as a silicon oxide film 3a is formed in the trench 1a in such a manner as to be embedded in the trench 1a. Then, planarizing is performed by a chemical mechanical polishing (CMP) method while using the silicon nitride film 8 as a stopper.

Figure 5F:
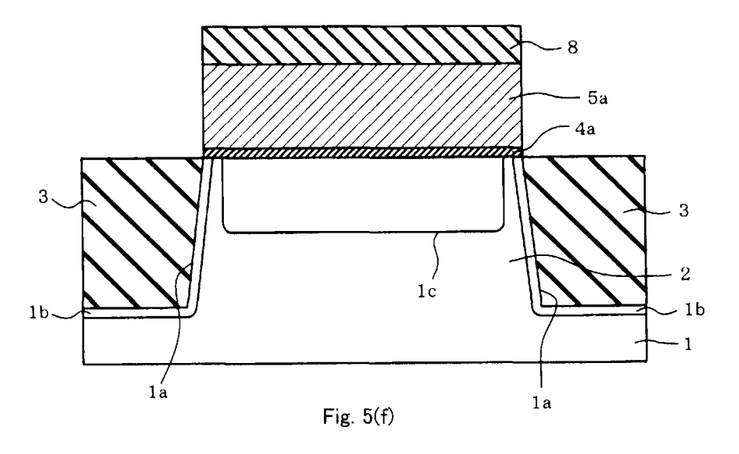

Next, as shown in FIG. 5F, the silicon oxide film 3a embedded in the trench 1a is etched back. As the result of the etching back, the silicon oxide film 3a is approximately flush with the upper surface of the silicon substrate 1. Such processing results in formation of the element isolation insulating film 3 having a shallow trench isolation (STI) structure. The etching back is performed by the RIE method or a wet etching method.

Figure 6G:
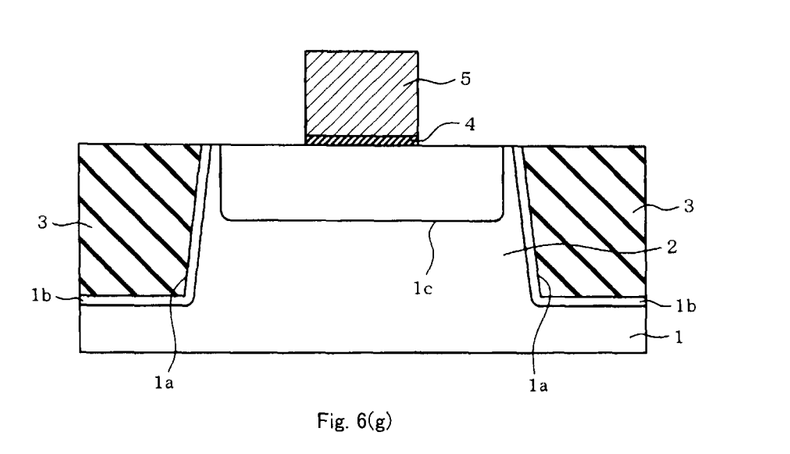
FIGS. 6G and 6H are schematic cross-sectional diagrams in steps, continued from FIG. 5F, of the manufacturing process according to the first embodiment.

Next, as shown in FIG. 6G, a mask pattern is formed by the photolithography method. Subsequently, the polysilicon film 5a and the silicon oxide film 4a are etched by the RIE method to form the gate electrode 5 and the gate insulating film 4.

Figure 6H:
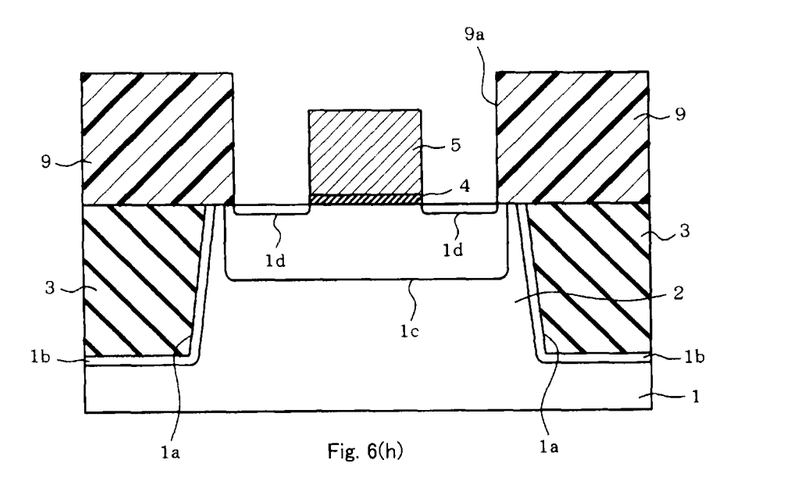

Next, as shown in FIG. 6H, a resist film 9 is applied by using the photolithography method. Then, patterning is performed on the resist film 9 in such a manner as to form openings 9a from which regions inside the n-channel region 1c are exposed. By using the resultant resist films 9 and the gate electrode 5 as masks, n-type impurities are introduced into the n-channel region 1c to form the LDD regions 1d. Thereby, the two LDD regions 1d are each formed in a region ranging from immediately below a corresponding one of the side surfaces of the gate electrode 5 to inward of the periphery of the n-channel region 1c. In addition, the two LDD regions 1d are each formed to have a depth smaller than that of the n-channel region 1c.

Figure 7I:
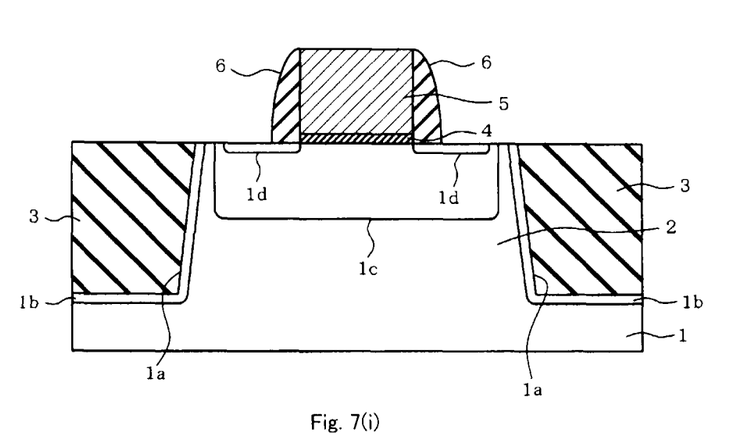
FIGS. 7I and 7J are schematic cross-sectional diagrams in steps, continued from FIG. 6H, of the manufacturing process according to the first embodiment.

Next, as shown in FIG. 7I, the spacer insulating films 6 using the silicon oxide films or the like are formed on the side surfaces of the gate electrode 5. Specifically, a silicon oxide film or the like is formed on the entire surface of the silicon substrate 1 to have a predetermined film thickness and then is etched back by the RIE method. Thereby, the spacer insulating films 6 can be formed. In the etching back, the silicon oxide film is removed in portions above the gate electrode 5, the element formation region 2, and the element isolation insulating film 3. In contrast, the silicon oxide film remains without being etched in portions on the side surfaces of the gate electrode 5. This results in formation of the spacer insulating films 6 each having a shape in which a top end portion thereof has a smaller width as illustrated in FIG. 7I.

Figure 7J:
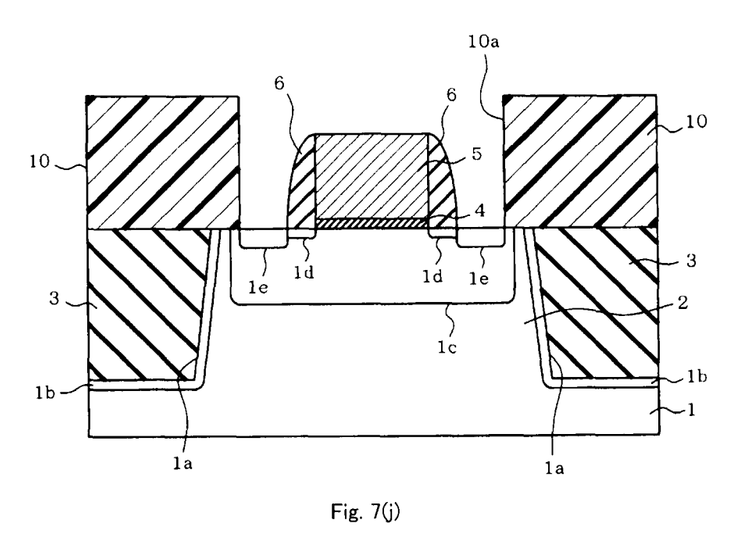

Next, as shown in FIG. 7J, a resist film 10 is applied by using the photolithography method. Patterning is performed on the resist film 10 in such a manner as to form openings 10a from which regions inside the n-channel region 1c are exposed. By using the resultant resist films 10, the gate electrode 5, and the spacer insulating films 6 as masks, n-type impurities are introduced at a high concentration into the two LDD regions 1d provided in the element formation region 2, to form the source/drain regions 1e, respectively. In this case, each of the source/drain regions be is formed in such a manner that an end portion thereof closer to the gate electrode 5 is located immediately below a side surface of the corresponding spacer insulating film 6. The source/drain regions 1e are located father from the gate electrode 5 than the LDD regions 1d are. Thereby, the LDD structure is formed.

Then, the resist film 10 is stripped to form the depletion-type n-channel MOSFET having the structure shown in FIG. 1A. Actually, various processing steps are further performed, such as forming an insulating film, a contact, or a wiring layer.

According to the first embodiment described above, in the element formation region 2 in which the surface portion of the silicon substrate 1 is isolated by the element isolation insulating film 3, the depletion-type n-channel region 1c is formed in such a manner as to be inward of and be the predetermined distance D away from the periphery of the element formation region 2. In sum, regions of the silicon substrate 1 including a lower concentration impurity are each located between the n-channel region 1c and the element isolation insulating film 3. Thus, the difference in impurity concentration is reduced and thereby, an effect of alleviating the electric field can be obtained. As a result, the breakdown voltage of the MOSFET can be enhanced.

Moreover, the MOSFET can be formed by employing the manufacturing process based on the manufacturing process for a NAND flash memory device. When being formed as an element of a peripheral circuit of the NAND flash memory device, the MOSFET can be formed by simply changing masks in the lithography processing. That is, the MOSFET can be manufactured without involving considerable change in process designing.

(Second Embodiment)

Next, a description is given of a second embodiment with reference to FIGS. 8A to 11G. In the second embodiment, the MOSFET including the depletion-type re-channel region having the structure shown in the first embodiment is formed in a different manufacturing process.

The structure of the MOSFET in the second embodiment is the same as that in the first embodiment, and thus a description thereof is omitted. The manufacturing process will be described below. Note that the manufacturing process to be described in the second embodiment is based on a manufacturing process flow for a general semiconductor integrated circuit of a logic IC or the like. In the following description of the manufacturing process, different part from the first embodiment is described, and the same part is omitted.

Figure 8A:
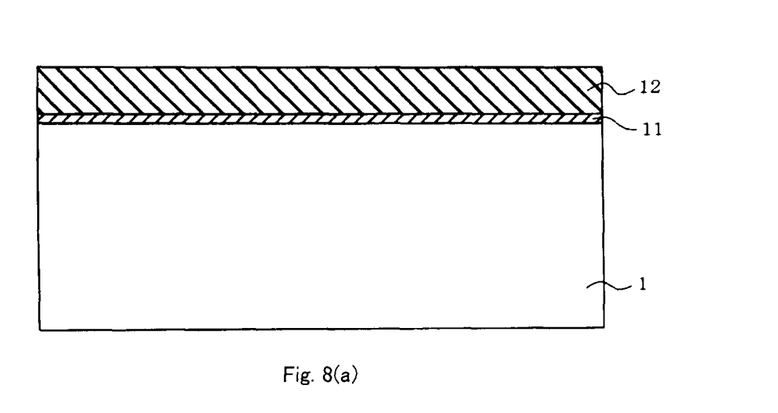
FIG. 8A and 8B are schematic cross-sectional diagrams in steps of a manufacturing process according to a second embodiment.
Figure 8B:
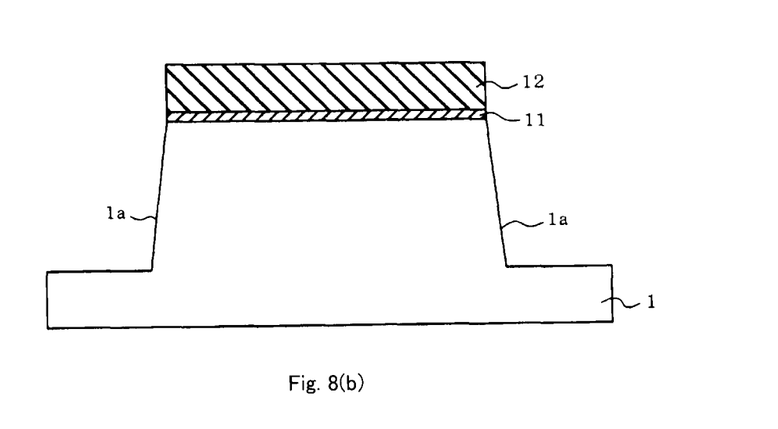

Firstly, as shown in FIG. 8A, a silicon oxide film 11 and a silicon nitride film 12 are formed on an upper surface of the p-type silicon substrate 1 as a semiconductor substrate. Subsequently, as shown in FIG. 8B, the trench 1a is formed while the square element formation region 2 shaped into an island is formed in an isolated manner. In this case, the trench 1a is formed in the following manner. Specifically, a resist film is formed into a mask pattern by the photolithography method. Etching is performed on the silicon nitride film 12 and the silicon oxide film 11 as well as the silicon substrate 1 to a predetermined depth by the RIE method, so that the trench 1a is formed.

Figure 9C:
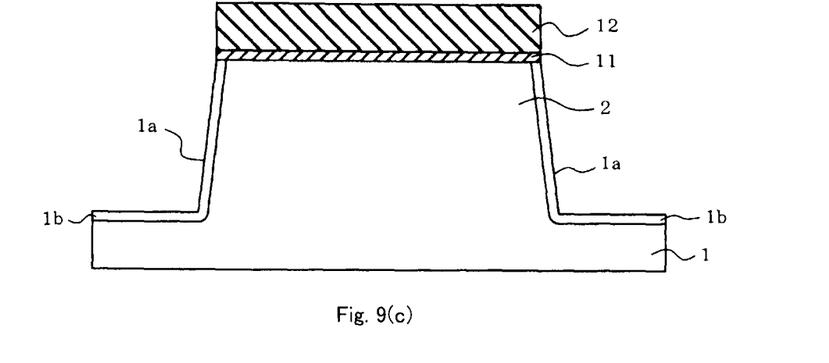
FIGS. 9C and 9D are schematic cross-sectional diagrams in steps, continued from FIG. 8B, of the manufacturing process according to the second embodiment.

Next, as shown in FIG. 9C, p-type impurity ions are implanted into the trench 1a thus formed. The p-type impurity region 1b is formed along a side surface and a bottom surface of the trench 1a.

Figure 9D:
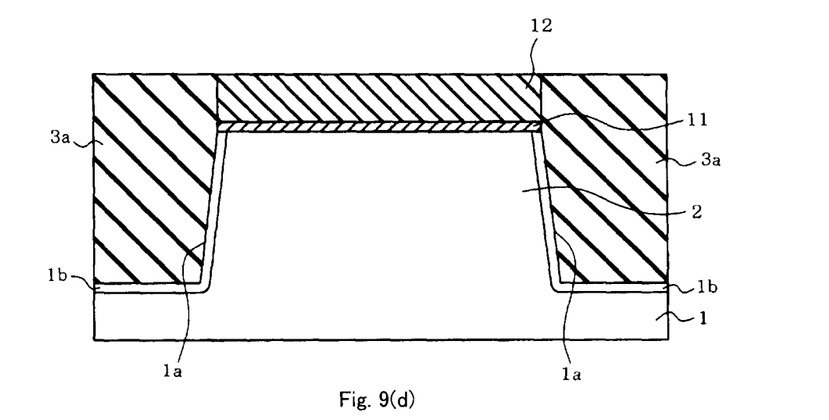
Figure 10E:
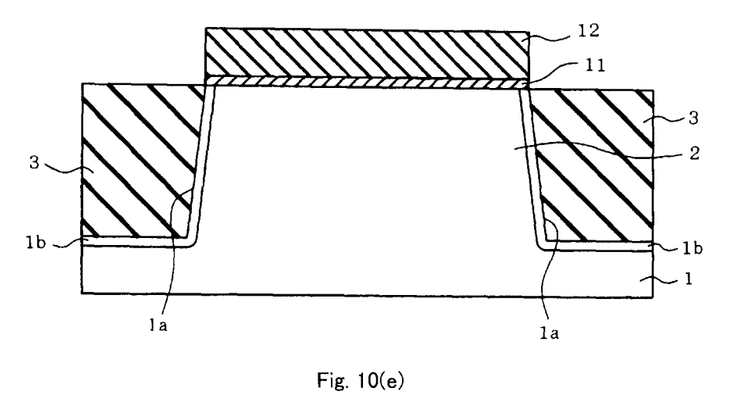
FIGS. 10E and 10F are schematic cross-sectional diagrams in steps, continued from FIG. 9D, of the manufacturing process according to the second embodiment.

Subsequently, as shown in FIG. 9D, the silicon oxide film 3a is formed in such a manner as to be embedded in the trench 1a. Then, planarizing is performed by the CMP method while using the silicon nitride film 12 as a stopper. Thereafter, as shown in FIG. 10E, the silicon oxide film 3a embedded in the trench 1a is etched back. The silicon oxide film 3a is processed so as to be flush with the upper surface of the silicon substrate 1.

Figure 10F:
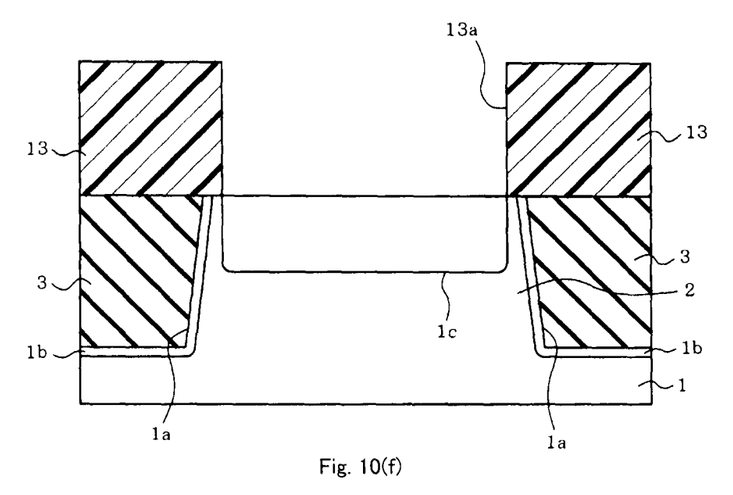

Next, as shown in FIG. 10F, a resist film 13 is applied on the element formation region 2 of the silicon substrate 1 and the element isolation insulating film 3. The resist film 13 is patterned in a lithography step. An opening 13a is formed in such a manner that a region which is inward of and a short distance away from the periphery of the element formation region 2 is opened. Then, an n-type impurity is introduced into the silicon substrate 1 from the opening 13a by ion implantation by using a resist film 13 as a mask. Thereby, the depletion-type n-channel region 1c is formed in a region inside the element formation region 2 of the silicon substrate 1.

Figure 11G:
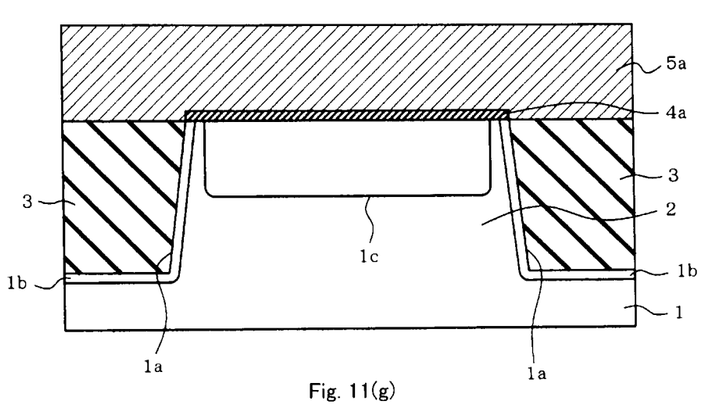
FIG. 11G is a schematic cross-sectional diagram in steps, continued from FIG. 10F, of the manufacturing process according to the second embodiment.

Next, as shown in FIG. 11G, the resist film 13 is stripped, and then the silicon oxide film 4a for the gate insulating film 4, the polysilicon film 5a for the gate electrode 5, and the silicon nitride film 8 for processing are stacked on the silicon substrate 1 in order.

Thereafter, the same steps as those in FIG. 6G and later which have been described in the first embodiment are performed, and thereby the MOSFET having the cross-sectional structure shown in FIG. 1A can be formed.

According to the second embodiment, like the first embodiment, the depletion-type n-channel region 1c is formed in such a manner as to be inward of and be the predetermined distance D away from the periphery of the element formation region 2. As a result, the breakdown voltage of the MOSFET can be enhanced.

Moreover, the MOSFET can be formed by employing the manufacturing process based on the manufacturing process for a general semiconductor integrated circuit. When being applied to a semiconductor integrated circuit, the manufacturing process can be used by simply changing masks in the lithography processing. Thus, the MOSFET can be manufactured without involving considerable change in process designing.

(Other Embodiment)

The following modification can be made in addition to the embodiments described above.

The description has been given of the case where the distance D is set based on distances between the n-channel region 1c and a side, of the element formation region 2, parallel to the gate electrode 5 and between the n-channel region 1c and a side thereof orthogonal to the gate electrode 5, the distances being equal to each other. Alternatively, instead of being based on the equal distance to the sides, distances D may be set based on different distances to the respective sides.

In the embodiments described above, the structure is employed in which each n-type source/drain region 1e is in contact with the corresponding spacer insulating film 6. However, the embodiments are not limited thereto. A structure may be employed in which the source/drain region 1e is not in contact with the spacer insulating film 6.

Moreover, a structure may be employed in which the LDD regions 1d or the spacer insulating films 6 are not provided. In this case, each source/drain region 1e may be formed in such a manner as not to be located immediately below the corresponding side surface of the gate electrode 5.

The trench 1a, provided in the silicon substrate 1, having the STI structure for the NAND flash memory device has been described as an example. However, a structure may be employed in which a deep trench is formed. Furthermore, a structure is also applicable in which an element isolation insulating film is provided in a different manner.

The description has been given by using the structure in which the n-channel region 1c is directly provided in the silicon substrate 1. However, the n-channel region 1c may be formed in a P-well formed in the silicon substrate 1.

The description has been given by using the structure in which the gate electrode 5 is formed by processing the single polysilicon film 5a. However, an electrode structure may be used in which a floating gate electrode and a control gate electrode are stacked with an inter-gate insulating film located in between, the floating and control gate electrodes being used for the NAND flash memory device. In this case, by employing a structure in which an opening is formed in the inter-gate insulating film for short-circuit between the floating gate electrode and the control gate electrode, a high-voltage resistant MOSFET having no floating gate electrode can be formed.

The example has been shown in which the p-type silicon substrate is used to provide the depletion-type re-channel region. However, the embodiments may be applied to a MOSFET having a structure in which an n-type silicon substrate is used to provide a depletion-type p-channel region.

The semiconductor substrate is not limited to the silicon substrate. The embodiments are also applicable to a carbonized silicon substrate or a substrate using a compound semiconductor.

The embodiments are also applicable to a non-volatile semiconductor storage device having a structure in which a high-voltage resistant depletion-type MOSFET is provided, as well as the NAND flash memory device. Furthermore, the embodiments are applicable to a general semiconductor integrated circuit having a structure in which a high-voltage resistant depletion-type MOSFET is provided.

Further, any two or more components of the specific examples may be combined within the extent of technical feasibility and are included in the scope of the invention to the extent that the purport of the invention is included.

Moreover, all methods for manufacturing semiconductor memory devices and semiconductor memory devices practicable by an appropriate design modification by one skilled in the art based on the methods for manufacturing the semiconductor memory devices and the semiconductor memory devices described above as embodiments of the invention also are within the scope of the invention to the extent that the purport of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device comprising: a semiconductor substrate; an element isolation insulating film which isolates an element formation region in a surface portion of the semiconductor substrate; a depletion-type channel region of a first conductivity type formed in an inner region which is in the element formation region of the semiconductor substrate of a second conductivity type and is spaced apart from the element isolation insulating film; a gate electrode formed above the element formation region with a gate insulating film located in between in such a manner as to traverse over the channel region and to overlap with portions of the element isolation insulating film which are located on both sides of the element formation region; source/drain regions of the first conductivity type which are formed in the channel region respectively on both sides of the gate electrode; and wherein D/W is equal to or more than 0.01 or 1% when the ratio D/W is expressed in percentage, where W is a distance of a portion of the element formation region over which the gate electrode traverses, and D is a distance between the channel region and the element isolation insulating film.

2. The semiconductor device according to claim 1, further comprising an impurity region in which an impurity of the second conductivity type is introduced into a portion of the semiconductor substrate, the portion facing the element isolation insulating film.

3. The semiconductor device according to claim 2, wherein the channel region is away from the impurity region.

4. The semiconductor device according to claim 1, wherein the element isolation insulating film is formed in such a manner as to be embedded in an element isolating trench formed in the surface portion of the semiconductor substrate.

5. A method of manufacturing a semiconductor device, comprising: forming a depletion-type channel region by introducing an impurity of a first conductivity type into a region in a surface portion of a semiconductor substrate of a second conductivity type; forming a gate insulating film and a gate electrode film on an upper surface of the semiconductor substrate; processing the gate electrode film, the gate insulating film, and the semiconductor substrate forming an element isolating trench in an outer region which is spaced apart from a periphery of the channel region;
  introducing an impurity of the second conductivity type into the element isolating trench forming an impurity region along a wall surface of the semiconductor substrate, the wall surface facing the element isolating trench;
  embedding an insulating film in the element isolating trench forming an element isolation insulating film; processing the gate electrode film in such a manner as to form a gate electrode; introducing an impurity of the first conductivity type into the channel region on both sides of the gate electrode forming source/drain regions; and
  wherein the gate electrode film, the gate insulating film, and the semiconductor substrate are processed in such a manner that D/W is equal to or more than 0.01 or 1% when the ratio D/W is expressed in percentage, where W is a distance of a portion of the element formation region over which the gate electrode traverses, and D is a distance between the channel region and the element isolation insulating film.

6. The method of manufacturing a semiconductor device according to claim 5, wherein the impurity of the second conductivity type is introduced into the element isolating trench in such a manner that the channel region is away from the impurity region.

7. A method of manufacturing a semiconductor device comprising: forming a CMP stopper film on an upper surface of a semiconductor substrate; forming an element isolating trench in a surface portion of the semiconductor substrate in such a manner that an element formation region is left;
  introducing an impurity of a second conductivity type into the element isolating trench forming an impurity region along a wall surface of the semiconductor substrate, the wall surface facing the element isolating trench;
  embedding an insulating film in the element isolating trench forming an element isolation insulating film;
  introducing an impurity of a first conductivity type into an inner region which is in the element formation region of the semiconductor substrate and is spaced apart from a periphery of the element isolation insulating film forming a depletion-type channel region;
  forming a gate insulating film and a gate electrode film in order on the upper surface of the semiconductor substrate;
  processing the gate electrode film forming a gate electrode;
  introducing an impurity of the first conductivity type into the channel region on both sides of the gate electrode forming source/drain regions; and
  wherein the impurity of the first conductivity type is introduced into the element formation region of the semiconductor substrate in such a manner that D/W is equal to or more than 0.01 or 1% when the ratio D/W is expressed in percentage, where W is a distance of a portion of the element formation region over which the gate electrode traverses, and D is a distance between the channel region and the element isolation insulating film.

8. The method of manufacturing a semiconductor device according to claim 7, wherein the impurity of the first conductivity type is introduced into the element formation region of the semiconductor substrate in such a manner that the channel region is away from the impurity region.

* * * * *